United States Patent

Parkhe et al.

Patent Number: 6,117,246
Date of Patent: Sep. 12, 2000

[54] CONDUCTIVE POLYMER PAD FOR SUPPORTING A WORKPIECE UPON A WORKPIECE SUPPORT SURFACE OF AN ELECTROSTATIC CHUCK

[75] Inventors: Vijay Parkhe, Sunnyvale; Gilbert Hausmann, Ben Lomond, both of Calif.

[73] Assignee: Applied Materials, Inc., Santa Clara, Calif.

[21] Appl. No.: 09/200,196

[22] Filed: Nov. 25, 1998

Related U.S. Application Data

[63] Continuation-in-part of application No. 08/791,941, Jan. 31, 1997.

[51] Int. Cl.[7] .................................................. C23C 16/00
[52] U.S. Cl. ............................................ 118/728; 361/234
[58] Field of Search ........................... 118/715, 728; 361/234, 233

[56] References Cited

U.S. PATENT DOCUMENTS

| | | | |
|---|---|---|---|
| 4,480,284 | 10/1984 | Tojo et al. | 361/234 |
| 4,724,510 | 2/1988 | Wicker et al. | 361/234 |
| 5,166,856 | 11/1992 | Liporace et al. | 361/233 |
| 5,179,498 | 1/1993 | Hongoh et al. | 361/234 |
| 5,191,506 | 3/1993 | Logan et al. | 361/234 |
| 5,255,153 | 10/1993 | Nozawa | 361/234 |
| 5,324,053 | 6/1994 | Kubota et al. | 279/128 |
| 5,486,974 | 1/1996 | Kasahara | 361/234 |
| 5,486,975 | 1/1996 | Shamouilian et al. | 361/234 |
| 5,522,131 | 6/1996 | Steger | 29/829 |
| 5,532,903 | 7/1996 | Kendall | 361/234 |
| 5,539,179 | 7/1996 | Nozawa et al. | 219/121.43 |
| 5,560,780 | 10/1996 | Wu et al. | 118/728 |
| 5,583,736 | 12/1996 | Anderson et al. | 361/234 |
| 5,631,803 | 5/1997 | Cameron et al. | 361/234 |
| 5,646,814 | 7/1997 | Shamouilian et al. | 361/234 |
| 5,691,876 | 11/1997 | Chen et al. | 361/234 |
| 5,745,331 | 4/1998 | Shamouilian et al. | 361/234 |
| 5,764,471 | 6/1998 | Burkhart | 361/234 |
| 5,777,838 | 7/1998 | Tamagawa et al. | 361/234 |

FOREIGN PATENT DOCUMENTS 63-194345  8/1988  Japan ............................ H01L 21/68

*Primary Examiner*—Richard Bueker
*Assistant Examiner*—Erin Fieler
*Attorney, Agent, or Firm*—Thomason Moser & Patterson

[57] ABSTRACT

This invention relates to an apparatus comprising a Johnsen-Rahbek electrostatic chuck having a conductive stand-off pad and a method of fabricating the chuck. More specifically, the stand-off pad is made of a conductive polymeric material, such as a polyimide, which is disposed upon a semiconducting or partially conducting layer of the chuck. The polymeric material has a controlled resistivity within a range of about $10^7$–$10^{12}$ ohm-cm, which allows a wafer, or other workpiece, to be supported and retained upon the electrostatic chuck via the Johnsen-Rahbek effect.

18 Claims, 2 Drawing Sheets

CONDUCTIVE POLYMER PAD FOR SUPPORTING A WORKPIECE UPON A WORKPIECE SUPPORT SURFACE OF AN ELECTROSTATIC CHUCK

This application is a continuation-in-part of U.S. patent application Ser. No. 08/791,941, filed Jan. 31, 1997, entitled STAND-OFF PAD FOR SUPPORTING A WAFER ON A SUBSTRATE SUPPORT CHUCK AND METHOD OF FABRICATING SAME, which is herein incorporated by reference.

BACKGROUND OF THE DISCLOSURE

1. Field of the Invention

The invention relates to a substrate support chuck within a semiconductor processing system. More particularly, the invention relates to the use of conductive polymeric pads as part of an electrostatic chuck for retaining a wafer by the Johnsen-Rahbek effect.

2. Description of the Background Art

Substrate support chucks are widely used to support substrates within a semiconductor wafer processing system. A particular type of chuck used in high-temperature semiconductor wafer processing systems, such as high-temperature physical vapor deposition (PVD), is a ceramic electrostatic chuck. These chucks are used to retain semiconductor wafers, or other workpieces, in a stationary position during processing. Such electrostatic chucks contain one or more electrodes imbedded within a ceramic chuck body. The ceramic material is typically aluminum-nitride or alumina doped with a metal oxide such as titanium oxide ($TiO_2$) or some other ceramic material with similar resistive properties. This form of ceramic is semiconductive at high temperatures.

In use, a wafer rests flush against the surface of the chuck body as a chucking voltage is applied to the electrodes. Because of the conductive nature of the ceramic material at high temperatures, the wafer is primarily retained against the ceramic support by the Johnsen-Rahbek effect. Such a chuck is disclosed in U.S. Pat. No. 5,117,121 issued May 26, 1992.

One disadvantage of using a chuck body fabricated from ceramic is that, during manufacture of the support, the ceramic material is "lapped" to produce a relatively smooth surface. Such lapping produces particles that adhere to the surface of the support. These particles are very difficult to completely remove from the surface. Additionally, the lapping process may fracture the surface of the chuck body. Consequently, as the chuck is used, particles are continuously produced by these fractures. Also, during wafer processing, the ceramic material can abrade the wafer oxide from the underside of the wafer resulting in further introduction of particulate contaminants to the process environment. During use of the chuck, the particles can adhere to the underside of the wafer and be carried to other process chambers or cause defects in the circuitry fabricated upon the wafer. It has been found that tens of thousands of contaminant particles may be found on the backside of a given wafer after retention upon a ceramic electrostatic chuck.

Similarly, substrate support chucks that are used in low-temperature processing (e.g., less than 300 degrees Celsius) may also produce contaminant particles that interfere with wafer processing. Such low-temperature chucks include electrostatic chucks and mechanical clamping chucks which contain wafer support surfaces that are typically fabricated from dielectric materials such as alumina. These types of chucks have also been found to produce particulate contaminants that can adhere to the underside of the wafer during processing.

A commonly assigned U.S. patent application Ser. No. 08/791,941, "Stand-Off Pad for Supporting a Wafer on a Substrate Support Chuck and Method of Fabricating Same", filed Jan. 31, 1997, overcomes the disadvantages of these prior art by the use of a polymeric stand-off pad, which supports a wafer in a spaced-apart relation to the chuck surface. Being less abrasive and more compliant than the chuck surface material, the polymeric pad significantly reduces particulate contamination. This commonly assigned patent application is hereby incorporated by reference.

A Japanese laid-open patent application (Kokai) no. 63-194345 discloses an electrostatic chuck with sheets of a conductive resin material locally arranged on the surface of an insulating film or ceramic material. The capacitance between the wafer and the insulating film is reduced by the increased distance interposed by the thickness of the conductive resin layer. This leads to a chuck with improved charging and discharging time responses, which operates through electrostatic attraction, or coulombic forces, from the charge build-up on an electrode beneath the insulating material.

However, the increased distance between the electrode and the wafer also leads to a correspondingly weaker electrostatic chucking force. Therefore, a need exists in the art for an electrostatic chuck that can avoid an abrasive contact with a wafer, reduce the amount of contaminant particles that may adhere to the backside of a wafer, and allow for a strong chucking force via the Johnsen-Rahbek effect.

SUMMARY OF THE INVENTION

The present invention relates to an electrostatic chuck having a stand-off pad made of a conductive polymeric material for retaining a substrate upon the chuck. With the conductive stand-off pad supporting a substrate, this invention offers the advantages of a non-abrasive wafer contact, reduced particulate contamination on the wafer backside, and a strong chucking force arising from the Johnsen-Rahbek effect.

The polymeric material of the stand-off pad has superior contact properties as compared to the chuck body material, including being less abrasive and more compliant. Particle generation due to abrasive contact is therefore avoided. The conductive stand-off pad may be fabricated from polymeric materials such as polyimide, fluoropolymers, and the like, by adding semiconducting or other conducting species to a polymeric chain structure. By properly adjusting the amount of conducting species in the polymer, the resistivity can be controlled within a range of about $10^{7}$–$10^{12}$ ohm-cm which allows the chuck to operate under the Johnsen-Rahbek effect.

Furthermore, the stand-off pad maintains a wafer, or other workpiece, in a spaced-apart relation to the underlying semiconducting chuck body, the backside of the wafer being separated from the chuck body by the thickness of the stand-off pad. Although the thickness of the stand-off pad is not critical to the present invention as it relates to the Johnsen-Rahbek force, it does affect a hybrid component of the total chucking force —a thicker stand-off pad results in a smaller hybrid component. The thickness of the stand-off pad should preferably be larger than the expected diameter of contaminant particles to avoid contaminant particles from adhering to the backside of the wafer during processing.

In one embodiment of the invention, the plurality of islands forming the wafer stand-off pad are formed by drop dispensing a polymeric solution onto the chuck body, and allowing the polymer to dry and cure. In another embodiment, the stand-off pad is formed by spin coating a polymeric material onto the chuck body and then selectively etching unwanted polymer material using an etch mask, and the like. Alternatively, photopolymers may also be used in conjunction with an appropriate lithographic technique to form the stand-off pad. Furthermore, the stand-off pad may also be fabricated by forming a pattern that is die cut from a sheet of polymeric material to yield a web pattern, i.e., a plurality of islands interconnected by connector strips. Other pre-defined patterns such as a plurality of spaced-apart pads, radial strips, concentric rings, or a combination of radial strips and concentric rings may also be used.

In another embodiment, the web is placed on the chuck body or in a corresponding recess pattern formed in the surface of the chuck body, and held in place with an adhesive or by other physical means (e.g., friction). This configuration facilitates the removal of the web for cleaning or replacement.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
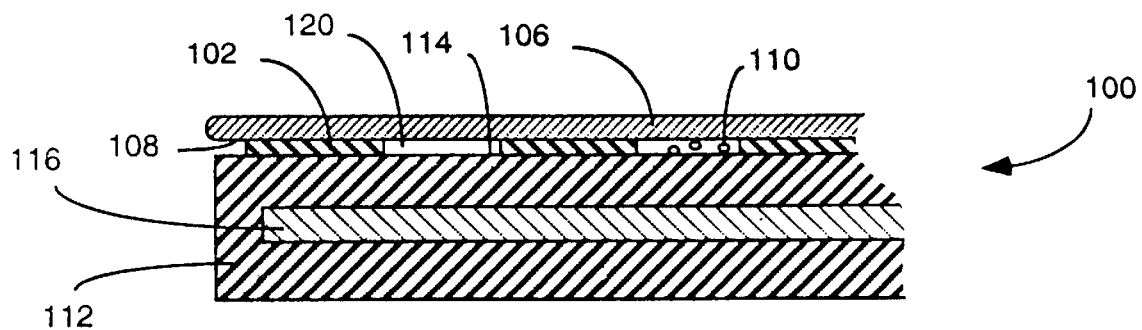
FIG. 1 depicts a cross-sectional view of a stand-off pad of the present invention, on the surface of a chuck, supporting a wafer.
Figure 2:
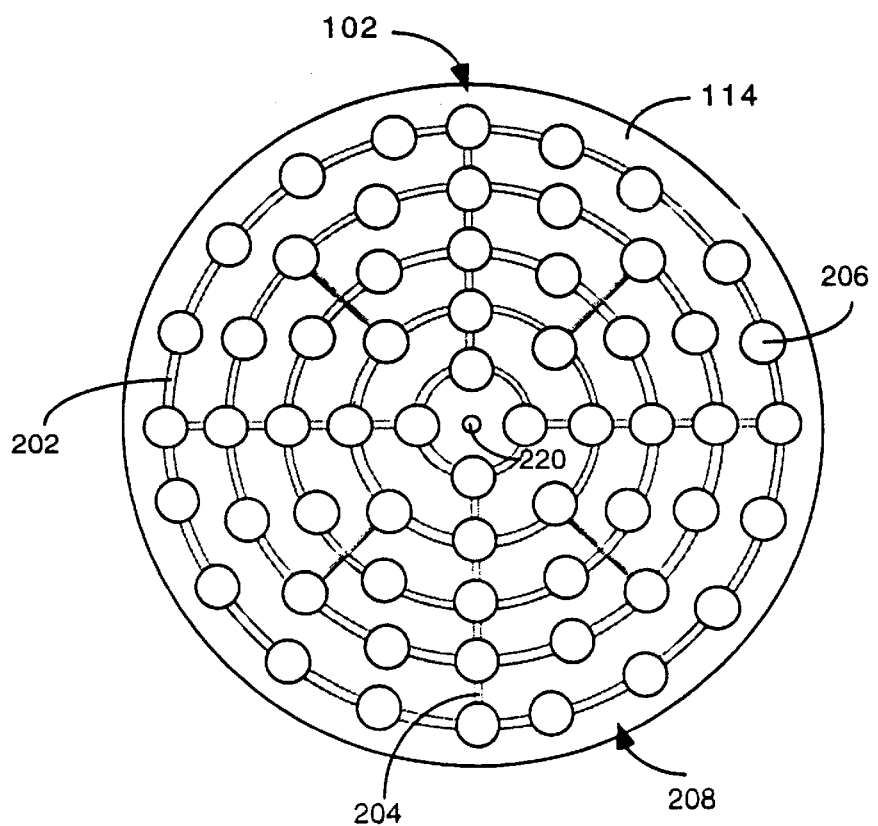
FIG. 2 depicts a top plan view of an illustrative pattern for the wafer stand-off pad.

FIG. 1 depicts a cross-sectional view of a wafer stand-off pad 102 of the present invention supporting a wafer 106 above the surface 114 of an electrostatic chuck (ESC) 100. To illustrate the use of the invention, FIG. 1 depicts the stand-off pad 102 supporting a semiconductor wafer 106. FIG. 2 depicts a top plan view of an illustrative pattern for the stand-off pad 102 of FIG. 1 (without the wafer 106). For best understanding of the invention, the reader should simultaneously refer to both FIGS. 1 and 2 while reading the following disclosure.

Although the preferred embodiment of the present invention is discussed as used in conjunction with a ceramic chuck body 112, the invention applies equally to a non-ceramic chuck body as well. A key feature of the present invention is that the polymeric pad 102 be made of a conductive material, with resistivity intermediate between that of an insulator and a conductor. Such intermediate resistivity allows the ESC 100 to operate via the Johnsen-Rahbek (J-R) effect, which provides a chucking force which is considerably stronger than that from electrostatic, or coulombic force alone. For example, a polymeric material with resistivity in the range of approximately $10^7$–$10^{12}$ ohm-cm will enable a workpiece or wafer substrate to be retained upon the chuck 100 by the Johnsen-Rahbek effect. This is several orders of magnitude lower than the resistivity typically used for an electrostatic chuck, which is about $10^{15}$ ohm-cm. Conductive polymers can be formed by adding conducting or semiconducting species to an otherwise non-conducting polymeric chain structure, such as polyimide, fluoropolymer and the like. For example, these conducting or semiconducting species may include carbon or silicon. By properly adjusting the amount of "dopants" in the polymeric chain, one can form conductive polymers with resistivities that can be controlled within certain desirable range, depending on the specific application needs. Note that although there is a certain temperature dependence in the resistivity of conducting polymers, the resulting resistivity change is typically less than an order of magnitude for the specific applications of interest, especially for applications below 300° C., where the temperature is controlled to within a relatively narrow range. Therefore, the temperature effect on the resistivity will generally not affect the conductive polymer's functionality as applied to a Johnsen-Rahbek chuck.

In a preferred embodiment, the electrostatic chuck 100 contains one or more electrodes 116 embedded within a ceramic chuck body 112. The ceramic chuck body 112 is, for example, fabricated of aluminum-nitride or boron-nitride. Such a partially conductive (semiconductive) ceramic material promotes the J-R effect which retains the wafer 106 during high temperature processing. Other semiconductive ceramics such as alumina doped with a titanium oxide or a chromium oxide also form useful high temperature chuck materials. If the chuck 100 is to be used at low temperatures only, then other ceramic and/or dielectric materials may be used, as long as the resistivity falls within a range appropriate for the J-R effect. An illustrative ceramic electrostatic chuck is disclosed in commonly assigned U.S. Pat. No. 5,511,799 issued Apr. 30, 1996, herein incorporated by reference. Examples of non-ceramic electrostatic chucks are disclosed in U.S. Pat. No. 4,184,188 issued Jan. 15, 1980 and U.S. Pat. No. 4,384,918 issued May 24, 1983, both of which are incorporated herein by reference.

FIG. 2 depicts a top plan view of a pattern for an illustrative stand-off pad 102 made of a conducting polymeric material. As depicted using solid lines, a plurality of individual islands 206 collectively form the pad 102. Typically, each island 206 has a diameter of approximately 1–10 mm, preferably 2–3 mm. They are spaced from one another and, depending upon the size and spacing of the islands, contact between 2% to 75% of the underside surface 108 of the wafer 106. Preferably, the islands 206 contact approximately 5% to 60% of the surface area of the wafer 106. The number, spacing and size of the islands 206 are related to the amount of clamping force required. Since the Johnsen-Rahbek chucking force is directly proportional to the surface contact area between the stand-off pad 102 and the wafer 106, for large clamping forces, the islands 206 should either be relatively large or positioned relatively densely near one another. Note that the thickness of the conductive polymeric pad 102 does not affect the Johnsen-Rahbek force, although it may play a role in the total chucking force by contributing to a hybrid component, i.e., a combination of the Johnsen-Rahbek effect and the Coulombic effect. This hybrid force varies inversely with the thickness of the polymeric pad 102. Therefore, depending on the specific combination of thickness and resistivity of the polymer pad 102, the hybrid component may become comparable to the J-R force under certain circumstances.

Alternatively, the islands 206 are interconnected by connecting strips 202 and 204 (shown in phantom) to form a web 208. More specifically, the connecting strips are a plurality of concentric rings 202 and radially extending connector strips 204. The rings 202, for example, are spaced from one another by approximately 0.64 cm. Furthermore, the rings 202 and/or the radial strips 204 could each be used separately as the wafer stand-off pad 102 with or without islands 206.

The key feature of the invention is that the wafer 106 is retained over the conductive polymeric pad 102 of an ESC 100 by the Johnsen-Rahbek effect. The particular stand-off pad pattern and pad material is defined by the specific application for the chuck 100. Factors to be considered include chucking voltage, chucking force, wafer thickness, the chuck electrode pattern, the process temperature, and so on.

Typically, the stand-off pad 102 is disposed upon the top surface 114 of the chuck body 112 by dispensing a polymer solution using a drop dispenser. After dispensing the polymer solution, the polymer is dried and cured. This method produces the plurality of individual support pads (islands 206) that are permanently adhered to the top surface 114 of the chuck The stand-off pad 102 may also be formed by spin coating a polymeric material onto the ceramic chuck body 112 at a thickness of about 1–200 μm, and preferably about 5–10 μm. The thickness, however, is not critical because it does not affect the Johnsen-Rahbek chucking force, although it may affect the hybrid component of the total chucking force. By using lithography and sputter etching, the spin-coated polymer layer may then be selectively etched to form the stand-off pad 102 upon the ceramic chuck body 112. For example, the stand-off pad 102 may be etched to form individual islands 206 or a web 208 of interconnected islands 206. Alternatively, photosensitive polymers may be used as the conducting polymeric material, and the stand-off pad 102 may be formed by an appropriate lithographic technique. Other methods such as decal transfer or stencil intaglio printing methods may also be used to form the stand-off pad 102.

To produce the web 208, a pattern is die cut from a sheet of polymeric material. A stand-off pad 102 having a web pattern does not require attachment to the top surface 114 by an adhesive. As such, the web 208 is easily removed from the top surface 114 of the chuck body 112 for cleaning or replaced by another stand-off pad 102 when worn or otherwise damaged. Alternatively, the stand-off pad 102 can be formed by dip coating a die-cut core of a thin metal sheet, such as aluminum, in a solution of a conductive polymer, such as doped polyimide, dissolved in a solvent, such as N-methyl pyrrolidine (NMP). The metal core adds support to the web 208, aiding in its placement on and removal from the ceramic surface 114.

Being less abrasive and more compliant, the polymeric pad 102 produces less particles than the ceramic surface 114 of the chuck body 112 upon contact with a wafer 106. A compliant material pad also minimizes breakage of the wafer 106 during rapid wafer transport upon placement on the chuck 100. In the present invention a doped polyimide is used to form the polymeric stand-off pad 102. Other compliant materials with similar conducting properties, i.e., resistivity in the range of approximately $10^7$–$10^{12}$ ohm-cm may also be used to reduce particulate contamination which may otherwise arise from abrasive contact with the backside 108 of the wafer 106.

To facilitate heat transfer from the wafer 106 to the chuck body 112, a heat transfer medium, e.g., a gas such as helium, is pumped into the space, or channel 120 between the backside surface 108 of the wafer 106 and the support surface 114 of the chuck body 112. This cooling technique is known as "backside cooling". The heat transfer medium is provided via a port 220 that is formed through the chuck body 112. The medium is typically supplied to the underside 108 of the wafer 106 at a rate of 2–30 sccm. The medium generally flows from the port 220 outward toward the edge of the wafer 106 and escapes into the reaction chamber environment. Inert gases such as helium and argon are suitable as a heat transfer medium. Such backside cooling is well-known in the art and is disclosed, for example, in a commonly assigned U.S. Pat. No. 5,228,501, issued to Tepman et al. on Jul. 20, 1993. Importantly, when backside cooling is used, the conductive polymer stand-off pad pattern has a three-fold purpose: (1) to support the wafer 106 to reduce backside particle adherence, (2) to provide wafer chucking from the J-R effect, and (3) to create heat transfer medium distribution channels upon the top surface 114 of the chuck body 112. Additional heat transfer medium distribution channels (not shown) may also be formed in the top surface 114 of the chuck body 112 to further aid distribution of the heat transfer medium across the underside 108 of the wafer 106. Such patterns of backside gas distribution channels vary in design and complexity, depending upon the application of the chuck 100.

Figure 3:
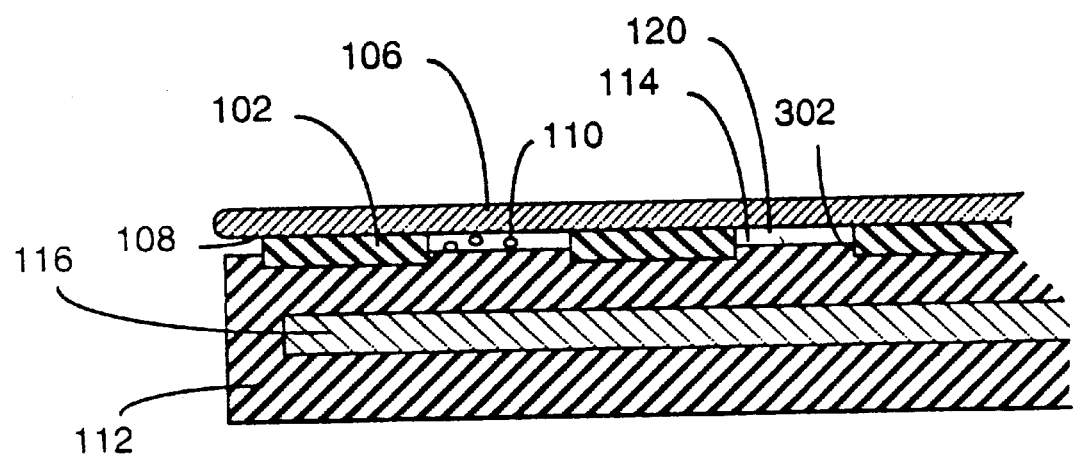
FIG. 3 depicts a cross-sectional view of a stand-off pad of the present invention, disposed on a corresponding patterned recess in the surface of a chuck, supporting a wafer.

FIG. 3 depicts a cross-sectional view of a stand-off pad 102 of the present invention, disposed in a recess 302 formed in the surface 114 of the chuck body 112. Specifically, the recess 302 in the surface 114 is patterned to match the pattern of the pad 102. The recess 302, which is milled, or otherwise formed, in the surface 114 of the ceramic chuck 100, has a depth less than the thickness of the wafer stand-off pad 102. The depth of the recess 302 may be in the range of 5–200 μm, and preferably 50–125 μm. As such, the conducting stand-off pad 102 projects above the surface 114 of the chuck body 112. Placing the stand-off pad 102 in the recess 302 aids in securing the stand-off pad 102 to the chuck 100, and prevents movement of the stand-off pad 102 during processing. The recessed pattern may also correspond to the backside gas distribution channels in the chuck surface 114.

Using the stand-off pad 102 in conjunction with a ceramic chuck has resulted in substantially decreased particulate contamination of wafers. Empirical data shows that a conventional ceramic chuck supporting a wafer directly upon its support surface can transfer tens of thousands of particles to the underside of a wafer. However, using the stand-off pad of the present invention reduces the particle count for particles located on the underside of a wafer to hundreds of particles.

Although various embodiments which incorporate the teachings of the present invention have been shown and described in detail herein, those skilled in the art can readily devise many other varied embodiments that still incorporate these teachings.

What is claimed is:

1. An electrostatic chuck having a workpiece support surface comprising:
    a patterned conductive polymeric material layer disposed atop the workpiece support surface; and
    said polymeric material layer being a material having a controlled resistivity to provide electrostatic chucking force via the Johnsen-Rahbek effect.

2. The electrostatic chuck of claim 1 wherein said polymeric material layer is a conductive polyimide.

3. The electrostatic chuck of claim 1 wherein said polymeric material layer is patterned to form a web.

4. The electrostatic chuck of claim 3 wherein said web comprises:

a plurality of islands; and a plurality of connector strips.

5. The electrostatic chuck of claim 3 wherein said web comprises a patterned metallic core coated with a conductive polymeric material.

6. The electrostatic chuck of claim 1 wherein said polymeric material layer is deposited upon the workpiece support surface to form a plurality of islands.

7. The electrostatic chuck of claim 6 wherein said polymeric material layer is patterned having connector strips interconnecting said islands.

8. The electrostatic chuck of claim 1 wherein said controlled resistivity is in the range of approximately $10^7$–$10^{12}$ ohm-cm.

9. An apparatus comprising:

a chuck having a semiconductive layer with a workpiece support surface;

a patterned stand-off pad disposed upon said workpiece support surface of said chuck, wherein said stand-off pad is made of a conductive polymeric material with controlled resistivity capable of retaining a workpiece upon said chuck via the Johnsen-Rahbek effect.

10. The apparatus of claim 9 wherein said polymeric material layer is a conductive polyimide.

11. The apparatus of claim 9 wherein said workpiece support surface contains a recess pattern.

12. The apparatus of claim 11 wherein said recess pattern corresponds to the shape of said stand-off pad, said stand-off pad is placed in said recess pattern.

13. The apparatus of claim 9 wherein said polymeric material layer is patterned to form a web.

14. The apparatus of claim 13 wherein said web comprises a patterned metallic core coated with a conductive polymeric material.

15. The apparatus of claim 13 wherein said web comprises:

a plurality of islands; and a plurality of connector strips.

16. The apparatus of claim 9 wherein said polymeric material layer is deposited upon the workpiece support surface to form a plurality of islands.

17. The apparatus of claim 16 wherein said polymeric material layer is patterned having connector strips interconnecting said islands.

18. The apparatus of claim 9 wherein said controlled resistivity is in the range of approximately $10^7$–$10^{12}$ ohm-cm.

* * * * *